US009818756B2

(12) United States Patent
Ramaswamy

(10) Patent No.: US 9,818,756 B2
(45) Date of Patent: Nov. 14, 2017

(54) METHODS OF FORMING A CHARGE-RETAINING TRANSISTOR HAVING SELECTIVELY-FORMED ISLANDS OF CHARGE-TRAPPING MATERIAL WITHIN A LATERAL RECESS

(71) Applicant: Micron Technology, Inc., Boise, ID (US)

(72) Inventor: D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/847,436

(22) Filed: Sep. 8, 2015

(65) Prior Publication Data
US 2015/0380432 A1 Dec. 31, 2015

Related U.S. Application Data

(62) Division of application No. 13/894,481, filed on May 15, 2013, now Pat. No. 9,159,845.

(51) Int. Cl.
*H01L 21/336* (2006.01)
*H01L 29/788* (2006.01)
(Continued)

(52) U.S. Cl.
CPC .. *H01L 27/11582* (2013.01); *H01L 21/28282* (2013.01); *H01L 21/28556* (2013.01);
(Continued)

(58) Field of Classification Search
CPC ......... H01L 27/11582; H01L 21/28568; H01L 21/28556; H01L 21/28282; H01L 29/788;
(Continued)

(56) References Cited

U.S. PATENT DOCUMENTS 6,057,193 A 5/2000 Wang et al.
6,063,666 A 5/2000 Chang et al.
(Continued)

FOREIGN PATENT DOCUMENTS

KR 10-2011-0000487 1/2011
KR 10-2011-0120654 11/2011
(Continued)

OTHER PUBLICATIONS

Electrical properties of crystalline YSZ films on silicon as alternative gate dielectrics Semicond. Sci. Technol. 16 (2001) L13-L16.

*Primary Examiner* — Marcos D Pizarro
*Assistant Examiner* — Nelson Garces
(74) *Attorney, Agent, or Firm* — Wells St. John P.S.

(57) ABSTRACT

A charge-retaining transistor includes a control gate and an inter-gate dielectric alongside the control gate. A charge-storage node of the transistor includes first semiconductor material alongside the inter-gate dielectric. Islands of charge-trapping material are alongside the first semiconductor material. An oxidation-protective material is alongside the islands. Second semiconductor material is alongside the oxidation-protective material, and is of some different composition from that of the oxidation-protective material. Tunnel dielectric is alongside the charge-storage node. Channel material is alongside the tunnel dielectric. Additional embodiments, including methods, are disclosed.

24 Claims, 5 Drawing Sheets

(51) Int. Cl.
- *H01L 29/02* (2006.01)
- *H01L 29/66* (2006.01)
- *H01L 29/792* (2006.01)
- *H01L 27/11582* (2017.01)
- *H01L 29/423* (2006.01)
- *H01L 27/11556* (2017.01)
- *H01L 21/28* (2006.01)
- *H01L 21/285* (2006.01)

(52) U.S. Cl.
CPC .. *H01L 21/28568* (2013.01); *H01L 27/11556* (2013.01); *H01L 29/42332* (2013.01); *H01L 29/42348* (2013.01); *H01L 29/66825* (2013.01); *H01L 29/66833* (2013.01); *H01L 29/788* (2013.01); *H01L 29/7881* (2013.01); *H01L 29/792* (2013.01)

(58) Field of Classification Search
CPC .......... H01L 27/11556; H01L 29/7881; H01L 29/42332; H01L 29/66825; H01L 29/42348; H01L 29/66833; H01L 29/792
USPC ................................. 257/310–330
See application file for complete search history.

(56) References Cited

U.S. PATENT DOCUMENTS

| | | | |
|---|---|---|---|
| 6,143,604 | A | 11/2000 | Chiang et al. |
| 6,180,454 | B1 | 1/2001 | Chang et al. |
| 6,274,471 | B1 | 8/2001 | Huang |
| 6,353,242 | B1 | 3/2002 | Watanabe et al. |
| 6,661,691 | B2 | 12/2003 | Fricke et al. |
| 6,803,318 | B1 | 10/2004 | Qiao et al. |
| 7,112,488 | B2 | 9/2006 | Helm et al. |
| 7,112,490 | B1 | 9/2006 | Hong et al. |
| 7,196,004 | B2 | 3/2007 | Lee et al. |
| 7,419,895 | B2 | 9/2008 | Lindsay |
| 7,713,819 | B2 | 5/2010 | Okajima |
| 7,790,360 | B2 | 9/2010 | Alapati et al. |
| 7,829,935 | B2 | 11/2010 | Makihara et al. |
| 7,898,856 | B2 | 3/2011 | Aritome |
| 7,906,818 | B2 | 3/2011 | Pekny |
| 7,968,406 | B2 | 6/2011 | Ramaswamy et al. |
| 8,148,216 | B2 | 4/2012 | Arai et al. |
| 8,183,110 | B2 | 5/2012 | Ramaswamy et al. |
| 8,187,938 | B2 | 5/2012 | Lim et al. |
| 8,207,570 | B2 | 6/2012 | Alapati et al. |
| 8,228,743 | B2 * | 7/2012 | Min .............. B82Y 10/00 257/314 |
| 8,237,213 | B2 | 8/2012 | Liu |
| 8,278,695 | B2 | 10/2012 | Kidoh et al. |
| 8,283,205 | B2 | 10/2012 | Pagaila et al. |
| 8,288,811 | B2 * | 10/2012 | Ramaswamy ........ B82Y 10/00 257/314 |
| 8,431,456 | B2 | 4/2013 | Alapati et al. |
| 8,437,192 | B2 | 5/2013 | Lung et al. |
| 8,450,791 | B2 * | 5/2013 | Alsmeier .......... H01L 27/11551 257/316 |
| 8,507,976 | B2 | 8/2013 | Joo |
| 8,969,153 | B2 | 3/2015 | Lee et al. |
| 2003/0201500 | A1 | 10/2003 | Furukawa et al. |
| 2005/0200026 | A1 | 9/2005 | Liaw |
| 2007/0004140 | A1 | 1/2007 | Jang et al. |
| 2007/0004141 | A1 | 1/2007 | Kim et al. |
| 2007/0048989 | A1 | 3/2007 | Ahn et al. |
| 2008/0009113 | A1 | 1/2008 | Shimzu |
| 2008/0179659 | A1 | 7/2008 | Enda et al. |
| 2008/0220600 | A1 | 9/2008 | Alapati et al. |
| 2008/0253183 | A1 | 10/2008 | Mizukami |
| 2009/0117725 | A1 | 5/2009 | Sun |
| 2009/0230454 | A1 | 9/2009 | Pekny |
| 2009/0289297 | A1 | 11/2009 | Kim et al. |
| 2009/0296476 | A1 | 12/2009 | Shin et al. |
| 2009/0310425 | A1 | 12/2009 | Sim et al. |
| 2010/0155813 | A1 | 6/2010 | Murata et al. |
| 2010/0171162 | A1 | 7/2010 | Katsumata et al. |
| 2010/0208503 | A1 | 8/2010 | Kuo |
| 2010/0258852 | A1 | 10/2010 | Lim et al. |
| 2010/0276743 | A1 | 11/2010 | Kuniya et al. |
| 2010/0295114 | A1 | 11/2010 | Alapati et al. |
| 2011/0019486 | A1 | 1/2011 | Jang et al. |
| 2011/0024816 | A1 | 2/2011 | Moon et al. |
| 2011/0031550 | A1 | 2/2011 | Komori et al. |
| 2011/0032772 | A1 | 2/2011 | Aritome |
| 2011/0140068 | A1 | 6/2011 | Ozawa |
| 2011/0147823 | A1 | 6/2011 | Kuk et al. |
| 2011/0149656 | A1 | 6/2011 | Tang et al. |
| 2011/0177661 | A1 | 7/2011 | Song et al. |
| 2011/0180865 | A1 | 7/2011 | Ramaswamy |
| 2011/0193153 | A1 | 8/2011 | Higuchi et al. |
| 2011/0241098 | A1 | 10/2011 | Park et al. |
| 2011/0291172 | A1 | 12/2011 | Hwang et al. |
| 2011/0316064 | A1 | 12/2011 | Kim et al. |
| 2012/0001249 | A1 | 1/2012 | Alsmeier et al. |
| 2012/0012921 | A1 | 1/2012 | Liu |
| 2012/0068247 | A1 | 3/2012 | Lee et al. |
| 2012/0086072 | A1 | 4/2012 | Yun et al. |
| 2012/0098050 | A1 | 4/2012 | Shim et al. |
| 2012/0119285 | A1 | 5/2012 | Yang |
| 2012/0135583 | A1 | 5/2012 | Jang et al. |
| 2012/0175697 | A1 | 7/2012 | Hall et al. |
| 2012/0184078 | A1 | 7/2012 | Kiyotoshi |
| 2012/0193596 | A1 | 8/2012 | Nakazawa |
| 2012/0205722 | A1 | 8/2012 | Lee et al. |
| 2012/0211822 | A1 | 8/2012 | Lim et al. |
| 2012/0211823 | A1 | 8/2012 | Lim et al. |
| 2012/0217564 | A1 | 8/2012 | Tang et al. |
| 2012/0220088 | A1 | 8/2012 | Alsmeier |
| 2012/0231593 | A1 * | 9/2012 | Joo ................. H01L 27/1203 438/264 |
| 2012/0238077 | A1 | 9/2012 | Alapati et al. |
| 2012/0241842 | A1 | 9/2012 | Matsuda |
| 2012/0329224 | A1 | 12/2012 | Kong et al. |
| 2013/0087843 | A1 * | 4/2013 | Han ................ B82Y 10/00 257/315 |
| 2013/0193503 | A1 | 8/2013 | Lee et al. |
| 2014/0008714 | A1 | 1/2014 | Makala et al. |
| 2014/0131784 | A1 * | 5/2014 | Davis ............... H01L 27/11556 257/316 |
| 2014/0162418 | A1 | 6/2014 | Keshav et al. |
| 2014/0191306 | A1 | 7/2014 | Hopkins |
| 2014/0191340 | A1 | 7/2014 | Thimmegowda et al. |
| 2014/0203344 | A1 | 7/2014 | Hopkins et al. |
| 2014/0217488 | A1 | 8/2014 | Thimmegowda et al. |
| 2014/0339621 | A1 | 11/2014 | Simsek-Ege et al. |
| 2014/0339624 | A1 | 11/2014 | Ramaswamy |

FOREIGN PATENT DOCUMENTS

| | | |
|---|---|---|
| KR | 10-2012-0113596 | 10/2012 |
| TW | 200845125 | 11/2008 |
| TW | 102138545 | 4/2015 |
| WO | WO PCT/US2013/063302 | 4/2014 |
| WO | WO PCT/US2014/011228 | 4/2014 |
| WO | WO PCT/US2013/063302 | 5/2015 |
| WO | WO PCT/US2014/011228 | 8/2015 |

* cited by examiner

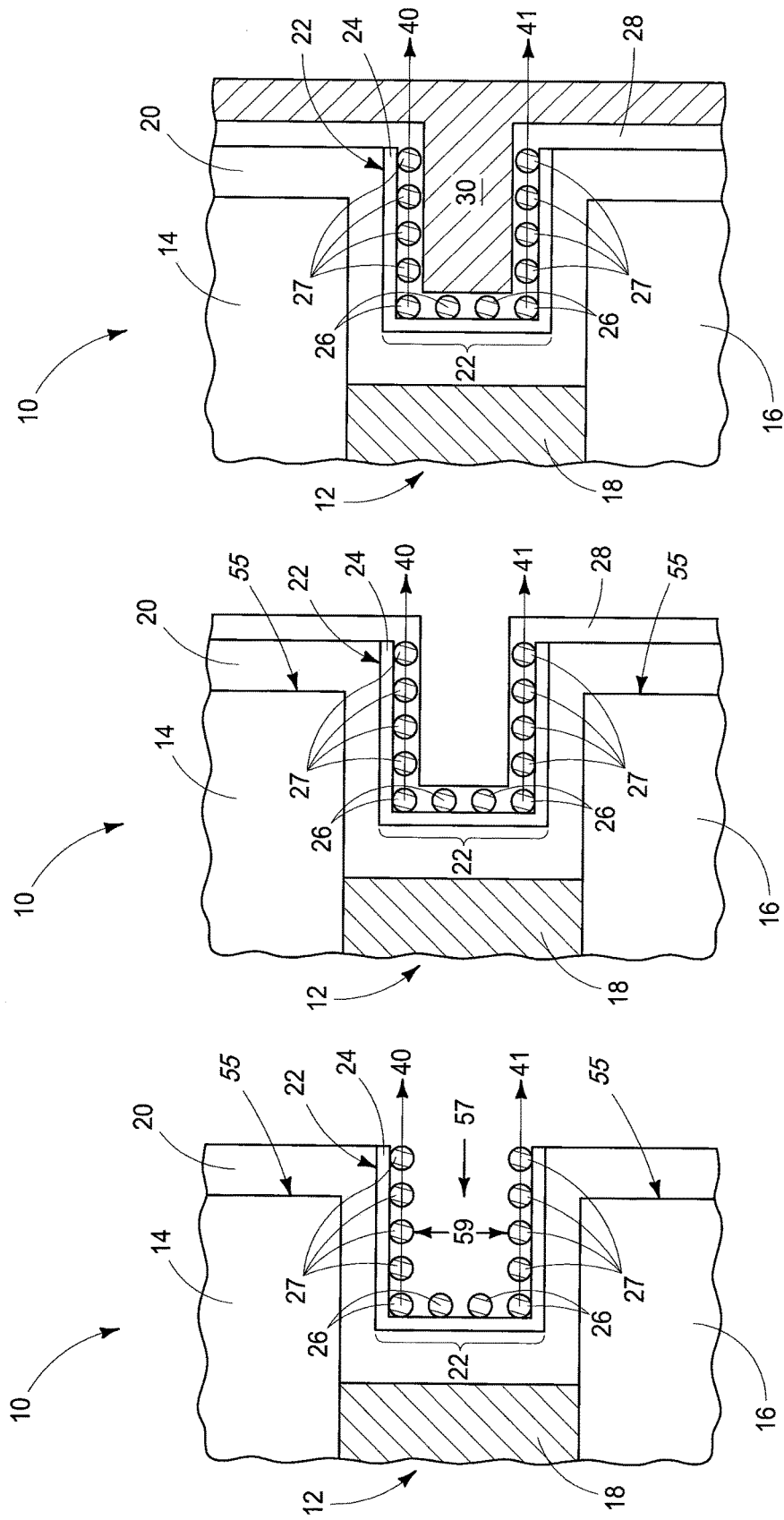

METHODS OF FORMING A CHARGE-RETAINING TRANSISTOR HAVING SELECTIVELY-FORMED ISLANDS OF CHARGE-TRAPPING MATERIAL WITHIN A LATERAL RECESS

RELATED PATENT DATA

This patent resulted from a divisional application of U.S. patent application Ser. No. 13/894,481, which was filed on May 15, 2013, entitled Charge-Retaining Transistor, Array Of Memory Cells, and Methods Of Forming A Charge-Retaining Transistor, the disclosure of which is incorporated herein by reference.

TECHNICAL FIELD

Embodiments disclosed herein pertain to charge-retaining transistors, to arrays of memory cells, and to methods of forming charge-retaining transistors.

BACKGROUND

Memory provides data storage for electronic systems. Flash memory is one type of memory, and has numerous uses in computers and other devices. For instance, personal computers may have BIOS stored on a flash memory chip. As another example, it is becoming increasingly common for computers and other devices to use flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

A typical flash memory comprises a memory array that includes a large number of memory cells arranged in row and column fashion. Individual memory cells include a charge-retaining transistor. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Flash memory cell strings have historically been arranged to extend horizontally, although vertically extending memory cell strings are now being considered. One goal in fabrication of vertical memory cell strings is to reduce the horizontal area of the substrate occupied by the memory cells as compared to horizontally extending memory cell strings, albeit typically at the expense of increased vertical thickness.

BRIEF DESCRIPTION OF THE DRAWINGS

FIG. 3 is a diagrammatic side elevational and sectional view of a substrate fragment in process in accordance with an embodiment of the invention.

FIG. 4 is a view of the FIG. 3 substrate at a processing step subsequent to that shown by FIG. 3.

FIG. 5 is a view of the FIG. 4 substrate at a processing step subsequent to that shown by FIG. 4.

FIG. 6 is a view of the FIG. 5 substrate at a processing step subsequent to that shown by FIG. 5.

FIG. 7 is a view of the FIG. 6 substrate at a processing step subsequent to that shown by FIG. 6.

DETAILED DESCRIPTION OF EXAMPLE EMBODIMENTS

Figure 1:
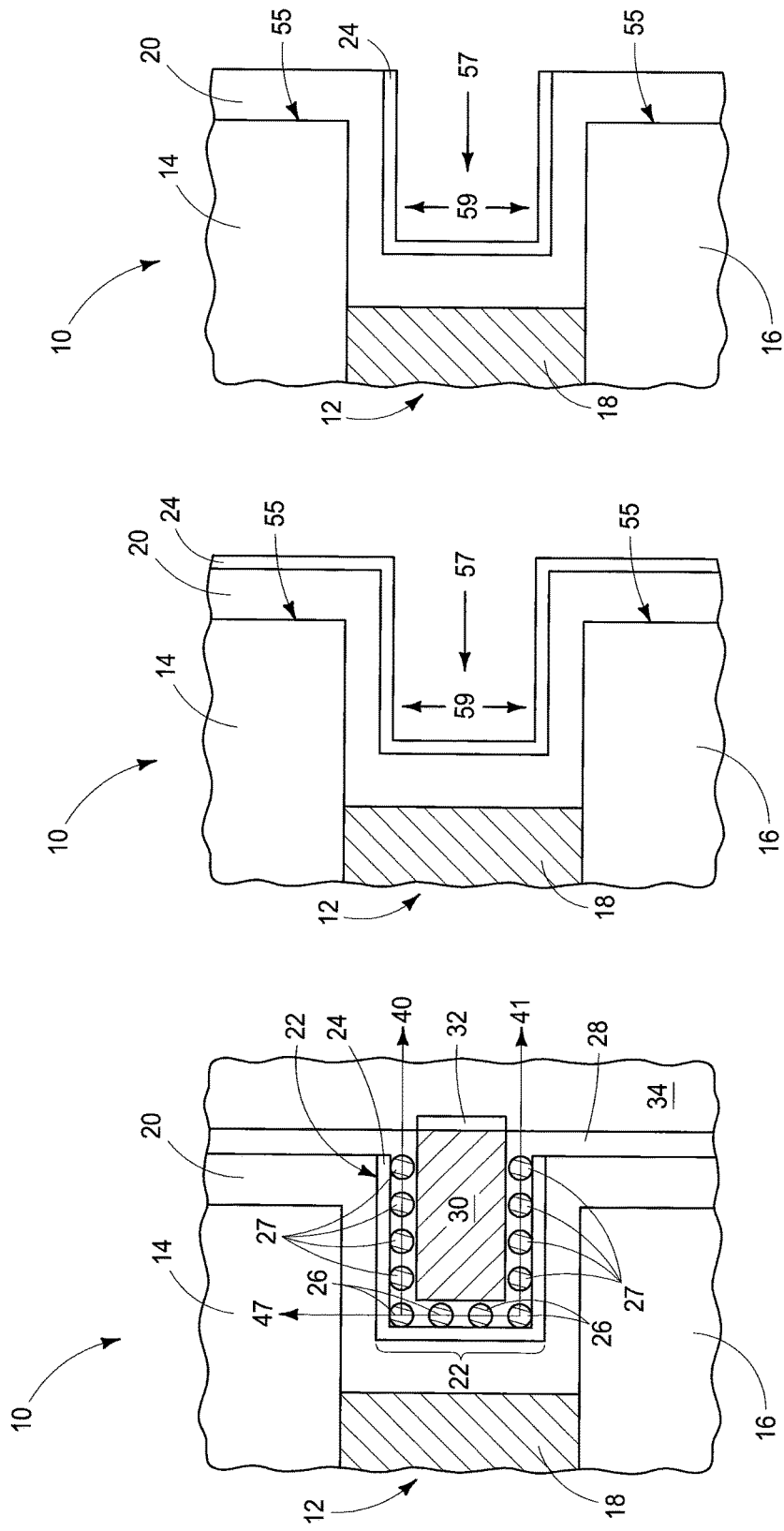
FIG. 1 is a diagrammatic side elevational and sectional view of a substrate fragment showing a charge-retaining transistor in accordance with an embodiment of the invention.

A charge-retaining transistor in accordance with an embodiment of the invention is described initially with reference to FIG. 1. Such a transistor may be incorporated in logic, memory (e.g., NAND and/or NOR), and/or other circuitry. FIG. 1 shows a substrate fragment 10 relative to which an example charge-retaining transistor 12 has been fabricated. Substrate fragment 10 comprises semiconductor material as described below and therefore comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In the depicted example, charge-retaining transistor 12 is largely received between an elevationally outer dielectric material 14 and an elevationally inner dielectric material 16. Any of the materials and/or structures described herein may be homogenous or non-homogenous, and regardless may be continuous or discontinuous over any material which such overlie. Further, such may be formed using any suitable or yet-to-be-developed technique (with or without plasma), with atomic layer deposition, chemical vapor deposition, physical vapor deposition, epitaxial growth, diffusion doping, and ion implanting being examples. Dielectric materials 14 and 16 may be of the same composition or of different compositions relative one another, with silicon oxide (e.g., silicon dioxide) and/or silicon nitride being examples. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

Circuitry components and/or other structure may be elevationally outward and elevationally inward of material 14, 16, and are not particularly germane to the initially-described embodiments. Additional embodiments are later described in more detail below, for example in incorporation of a plurality of charge-retaining transistors 12 within an array of memory cells.

Charge-retaining transistor 12 includes a control gate 18. Such comprises one or more conductive materials. As examples, control gate 18 may comprise conductively-doped silicon (e.g., monocrystalline and/or polysilicon) and/or metal-containing material, such as a refractory metal silicide alone or in combination with conductively-doped silicon. Example metal silicides are those derived from one or more of chromium, cobalt, hafnium, molybdenum, niobium, tantalum, titanium, tungsten, vanadium, and zirconium. Additional examples are titanium, tungsten, titanium nitride, and tungsten nitride. The conductive control gate material may comprise any combination of two or more different composition conductive materials. Dielectric material (not shown in FIG. 1) would likely be positioned to the left of the FIG. 1-illustrated control gate 18 for electrical isolation. Control gate 18 may be associated with multiple charge-retaining transistors, for example running into and out of the plane of the page upon which FIG. 1 lies.

An inter-gate dielectric 20 is alongside control gate 18. In the context of this document, "alongside" only requires that the stated structure or material include some portion that is positioned laterally (i.e., relative to horizontal) of the other stated material or structure. Such does not require the stated material or structure to extend continuously or all-along the other stated material or structure, unless so-stated in a claim. In this document, "horizontal" refers to a general direction along a primary surface relative to which the substrate is processed during fabrication, and "vertical" is a direction generally orthogonal thereto. Further as used herein, "vertical" and "horizontal" are generally perpendicular directions relative one another independent of orientation of the substrate in three-dimensional space. Further in this document, "elevational" and "elevationally" are generally with reference to the vertical direction.

Inter-gate dielectric 20 is shown extending continuously and all-along a side of control gate 18, although other constructions might be used. Regardless, inter-gate dielectric 20 may or may not be of uniform thickness orthogonal to closest surfaces over which such lies. Inter-gate dielectric 20 is also shown as having opposing segments extending laterally away from control gate 18 along the depicted horizontal surfaces of dielectric material 14 and 16, and then along the depicted vertical surface of dielectric material 14 and 16. Alternately as examples, the inter-gate dielectric might not include segments that extend along one or both of such surfaces of material 14 and 16. Accordingly, that portion of inter-gate dielectric 20 that extends alongside control gate 18 may primarily be the operative part of inter-gate dielectric 20 in charge-retaining transistor 12. Example inter-gate dielectric materials include one or more of silicon oxide, silicon nitride, hafnium oxide, zirconium oxide, aluminum oxide, and aluminum hafnium oxide.

Charge-retaining transistor 12 includes a charge-storage node 22 alongside inter-gate dielectric 20, a tunnel dielectric 32 alongside charge-storage node 22, and channel material 34 alongside tunnel dielectric 32. Charge-storage node 22 comprises first semiconductor material 24, islands of charge-trapping material 26, 27, oxidation-protective material 28, and second semiconductor material 30. At least some of first semiconductor material 24 is alongside inter-gate dielectric 20. At least some of charge-trapping islands 26/27 are alongside first semiconductor material 24. At least some of oxidation-protective material 28 is alongside at least some of charge-trapping islands 26/27. At least some of second semiconductor material 30 is alongside at least some of oxidation-protective material 28, and is of some different composition from that of oxidation-protective material 28.

In one embodiment, first semiconductor material 24 is directly against inter-gate dielectric 20. In one embodiment, charge-trapping islands 26/27 are directly against first semiconductor material 24. In one embodiment, oxidation-protective material 28 is directly against charge-trapping islands 26/27. In one embodiment, second semiconductor material 30 is directly against oxidation-protective material 28. In one embodiment, oxidation-protective material 28 covers all of at least one side of charge-trapping islands 26/27, and all of at least one of elevationally outermost surfaces and elevationally innermost surfaces of islands 26/27.

First semiconductor material 24 may comprise doped or un-doped semiconductive material, for example amorphous, monocrystalline and/or polycrystalline silicon. An example thickness is from about 20 Angstroms to about 30 Angstroms.

Charge-trapping islands 26/27 may comprise electrically conductive charge-trapping material and/or dielectric charge-trapping material. The charge-trapping material may be metal, for example one or more of metal nitrides or metal oxides such as conductive refractory metal nitrides or conductive refractory metal oxides. In one embodiment, charge-trapping islands 26/27 comprise elemental ruthenium, an alloy including elemental ruthenium and at least one other metal element, and/or ruthenium silicide. As additional example charge-trapping material, the islands can comprise doped semiconductor material (e.g., doped germanium and/or silicon), metals other than or in addition to ruthenium (e.g., rhenium, platinum, titanium, tantalum, tungsten), metal nitrides (titanium nitride, tantalum nitride, tungsten nitride), metal oxides (e.g., ruthenium oxide), metal alloys, metal-alloy-nitrides, and/or ruthenium rare earth combinations. Regardless, islands 26/27 may correspond to nanocrystals of nanoparticles such as, for example, nanodots. As an example, nanodots may have an average size of about 15 Angstroms to about 20 Angstroms and a relative spacing there-between of about 10 Angstroms to about 20 Angstroms. While islands 26/27 are shown as being of the same relative size and uniform spacing, such may be of a variety of sizes and/or have a variety of relative spacings. Further, such may contact one another forming larger islands of a plurality of nanodots or other particles. Further while illustrated as a single layer of islands 26/27, embodiments of the disclosure encompass charge storage nodes which comprise multiple layers of islands 26/27 separated by dielectric material. Regardless, and in one embodiment, islands 26/27 may have maximal cross-sectional dimensions of from about 10 Angstroms to about 500 Angstroms.

Oxidation-protective material 28 may protect charge-trapping islands 26/27 from oxidation during formation of semiconductor material 30 and/or tunnel dielectric 32. For example where islands 26/27 comprise elemental-form ruthenium, if such is exposed to $O_3$, $RuO_4$ may form which is volatile and thereby effectively etches away the original ruthenium. In one embodiment, oxidation-protective material 28 may be formed by subjecting ruthenium-containing islands 26/27 to $O_2$ at a temperature of about 600° C. to form $RuO_2$ which is more stable and not volatile in $O_3$ in comparison to $RuO_4$. Accordingly, oxidation-protective material 28 may comprise ruthenium dioxide that may form as a continuous or dis-continuous material. For example, such may be discontinuous (not shown), or as a continuous or discontinuous coating (not shown) formed over individual islands 26/27 but not connected between islands (not shown).

Example additional oxidation-protective materials include silicon nitride and $HfO_x$. Oxidation-protective material 28 may be formed by an atomic layer deposition (ALD) process, for example a water-based high-K dielectric as described in U.S. Pat. No. 8,288,811. The oxidation-protective material may be amorphous or crystalline, for example deposited and composed of materials described in U.S. Pat. No. 7,968,406, both of such patents which are herein incorporated by reference with respect to various processes and materials that may be used in a charge-retaining transistor. Regardless, an example thickness range for oxidation-protective material 28 is from about 5 Angstroms to about 20 Angstroms, with from about 5 Angstroms to about 10 Angstroms being ideal.

Example second semiconductor materials 30 include those described above with respect to first semiconductor material 24. First semiconductor material 24 and second semiconductor material 30 may be of the same composition or of different compositions relative one another.

Tunnel dielectric 32 may comprise any suitable composition or combination of compositions, and may for example include one or more of silicon oxide, hafnium oxide, zirconium oxide, and aluminum oxide. An example lateral thickness is one that provides an equivalent silicon dioxide thickness of from about 10 Angstroms to about 70 Angstroms. Tunnel dielectric 32 and inter-gate dielectric 20 may be of the same composition or of different compositions relative one another.

Example channel materials 34 include semiconductive material (e.g., polysilicon) doped with appropriate concentration of one or more conductivity-modifying dopants.

In one embodiment, charge-trapping islands 26/27 include a line thereof (e.g., either of line 40 or line 41) that extends laterally relative to orientation of tunnel dielectric 32. For example, islands 27 may be considered as including or defining a line 40 or 41 that extends laterally relative to the tunnel dielectric orientation. Alternately or additionally, charge-trapping islands 27 may be considered as forming a line 40 or 41 which angles laterally away from charge-trapping islands 26. One line or more than one line may be used, with two lines 40 and 41 being shown. When more than one line is provided, such may be oriented parallel or otherwise relative one another. Additionally, any such line may be straight (as shown), curved or curvy, a combination of curved and straight segments, etc. Further, any such line may be oriented generally orthogonally relative to the tunnel dielectric orientation and/or charge-trapping islands 26 that are alongside semiconductor material 24. Alternately, charge trapping islands 27 may angle laterally away at other than 90°.

Charge-trapping islands 27 may be intentionally provided and/or may be an artifact of manufacture (e.g., unintentional). Regardless, in one embodiment, at least some of the charge-trapping islands may be inoperative as respects charge-trapping function in all charge-retaining states of the charge-retaining transistor. For example and by way of example only, charge-trapping islands 26 that are most-proximate alongside semiconductor material 24 may provide a measurable or determining charge-trapping function in different charge-retaining states of the charge-retaining transistor whereas some or all of islands 27 do not. For example, those islands 27 which are further to the right (in FIG. 1) away from islands 26 may provide negligible if any charge-trapping function in determining or setting charge-retaining state of the transistor in operation.

In one embodiment, a charge-storage node in a charge-retaining transistor in accordance with the invention comprises first islands of charge-trapping material alongside an inter-gate dielectric. A line of second islands of charge-trapping material angles laterally away from the first islands. Semiconductor material is alongside the first islands in such a charge-storage node, and independent of whether first and second semiconductive materials as described above are provided, and independent of whether an oxidation-protective material as described above is provided. For example with respect to the FIG. 1 embodiment, charge-trapping islands 26 may be considered as first islands that are provided along inter-gate dielectric 20 (e.g., extending along a line 47) independent of presence of semiconductor material 24. Either of lines 40 or 41 of charge-trapping islands 27 may be considered as a line of second islands angling away from first islands 26. Semiconductor material 30 is alongside first islands 26. Any other attribute as described above may be used. Further and regardless, charge-trapping material of the first and second islands may be of the same composition or of different compositions relative one another.

Figure 2:
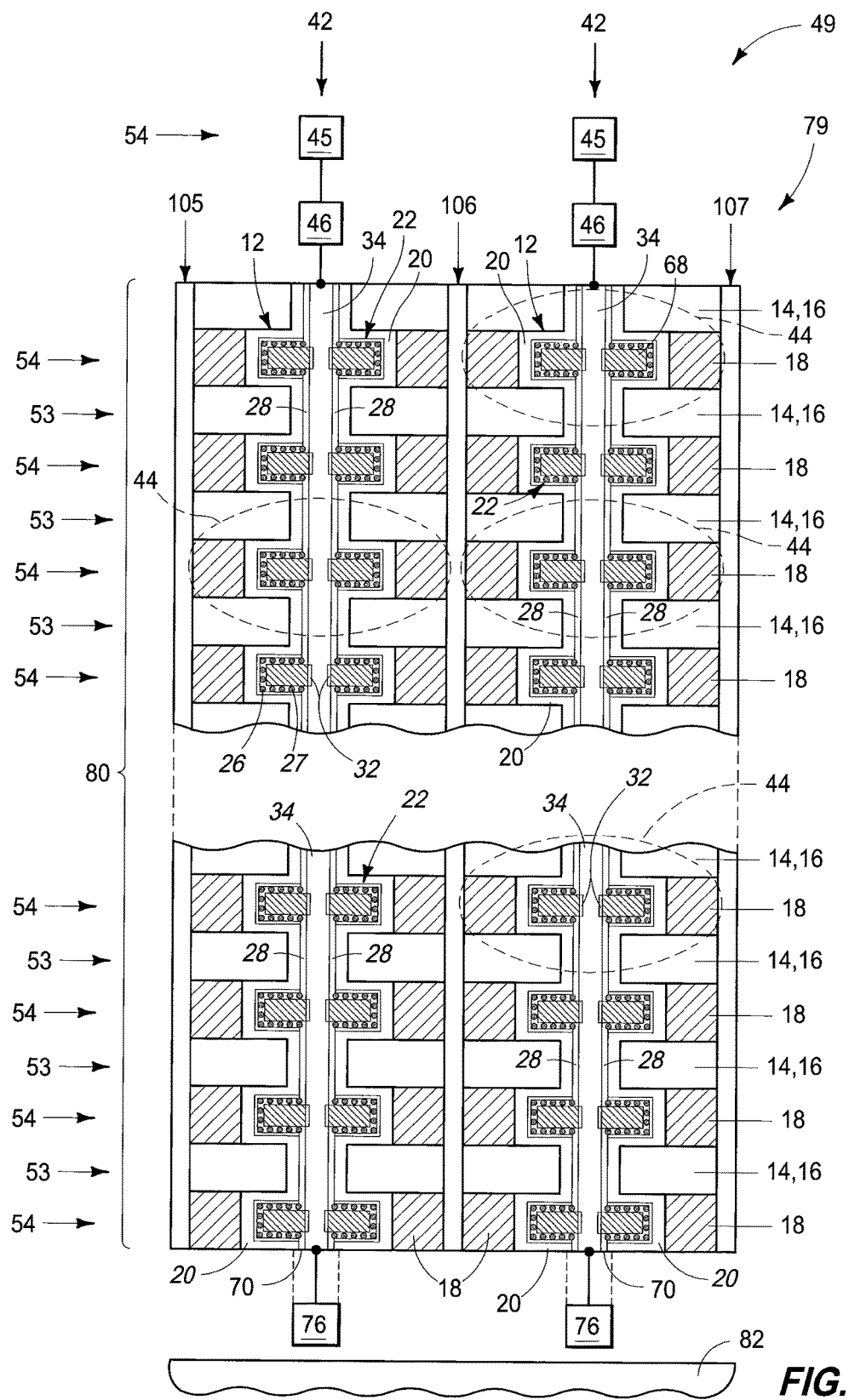
FIG. 2 is a hybrid-structural schematic, in side elevation cross-section, of a memory array in accordance with an embodiment of the invention.

Charge-retaining transistors in accordance with embodiments of the invention may be used in any existing or yet-to-be-developed integrated circuitry. Some embodiments of the invention include an array of elevationally extending strings of memory cells where individual of the memory cells comprise a charge-retaining transistor in accordance with any of the above-described embodiments. An example such array 49 is shown in a hybrid schematic and structural manner in FIG. 2. Like numerals from the above-described embodiments have been used where appropriate. FIG. 2 shows an example construction 79 which includes a stack 80 supported by a base 82. Base 82 may comprise a semiconductor substrate. Individual elevationally extending strings 42 are indicated schematically in FIG. 2 by vertical lines and memory cells by circles 44 (sixteen memory cells being shown). Elevationally extending strings may extend vertically in one embodiment. Any existing or yet-to-be-developed memory architecture may be used. Regardless, memory cells 44 may be serially coupled relative one another within individual strings 42 as shown in FIG. 2, or may be otherwise arranged within individual strings. Dielectric material 105, 106, 107 may electrically isolate adjacent elevationally extending strings 42 of memory cells.

Array 49 includes alternating tiers of inter-tier dielectric material 14, 16 (e.g., tiers 53) and transistor material (e.g., tiers 54) which form a part of charge-retaining transistors 12. Channel material 34 of the FIG. 1 embodiment is shown as comprising active area pillars which extend through alternating tiers 53, 54. Active area pillars 34 may be circular or of other shape in cross-section. The transistor material within tiers 54 comprises control gates 18, inter-gate dielectric 20 alongside control gates 18, charge-storage nodes 22, and tunnel dielectric 32 laterally between charge-storage nodes 22 and active area pillars 34. Control gates 18, inter-gate dielectric 20, charge-storage nodes 22, and tunnel dielectric 32 may encircle an active area pillar 34 whereby the charge-storage node forms an annulus about an individual active area pillar 34 within a tier 54. Control gate material 18 may join with itself (not shown) into and out of the plane of the page on which FIG. 2 lies to extend horizontally into and out of the plane of the page within an individual tier 54, and may comprise respective individual access lines.

An array of select devices 46 is elevationally over strings 42, with select devices 46 individually coupling (i.e., electrically) with individual strings 42. Select devices 46 may connect with other circuitry 45. The select devices may comprise transistors. For example, select devices 46 may comprise one or a combination of select gate drains (SGD's) and select gate sources (SGS's). Select devices 46 may all be SGD's and an array of SGS's 76 may be provided elevationally inward of tiers 54, 53 and which individually couple with individual memory cell strings 42. Conductive contacts or other circuitry 45 may be in the form of bit lines running orthogonal to the plane of the page on which FIG. 2 lies, for example coupling with an elevationally outer source/drain region (not shown) of individual select devices 46 that are in different columns.

Regardless, individual charge-storage nodes within array 49 as a minimum include islands of charge-trapping material and an oxidation-protective material alongside those islands. The oxidation-protective material extends elevationally alongside the active area pillar between the active area pillar and the inter-tier dielectric. For example, as shown, oxidation-protective material 28 extends elevationally alongside active area pillar 34 between inter-tier dielectric 14, 16 and active area pillars 34. In one array-embodiment and as-shown, individual charge-storage nodes 22 comprise first semiconductor material 24 alongside and between inter-gate dielectric 20 and islands 26. Further in one array-embodiment and as shown, second semiconductor material 30 is alongside and between oxidation-protective material 28 and tunnel dielectric 32. Second semiconductor material 30 is of some different composition from that of oxidation-protective material 28.

Embodiments of the invention encompass methods of forming a charge-retaining transistor, for example a transistor as described in any of the above embodiments and in connection with fabrication of an array of memory cells in accordance with FIG. 2 or otherwise. Example method embodiments are next described with reference to FIG. 3-7 in fabrication of the example FIG. 1 embodiment. FIG. 3 shows an example predecessor substrate fragment to that of FIG. 1, and which comprises control gate 18 and inter-gate dielectric 20 alongside control gate 18 between elevationally inner and outer dielectric material 16, 14, respectively. Inner and outer dielectric material 16, 14 can be considered as having sidewalls 55, with control gate 18 being laterally recessed relative thereto. A lateral recess 57 is thereby formed, and has recess walls 59. Inter-gate dielectric 20 may extend along walls 55, as shown. Regardless, semiconductor material 24 (e.g., first semiconductor material) has been formed along sidewalls 55 of inner and outer dielectric material 16, 14 and to less-than-fill and line walls 59 of lateral recess 57.

Referring to FIG. 4, semiconductor material 24 has been removed from being along sidewalls 55 of inner and outer dielectric material 16, 14, leaving first semiconductor material 24 lining walls 59 of lateral recess 57. An example technique for doing so is dry anisotropic etching.

Referring to FIG. 5, islands 26/27 of charge-trapping material have been selectively formed within lateral recess 57 on semiconductor material 24 selectively relative to sidewalls 55 of inner and outer dielectric material (i.e., regardless of whether sidewalls 55 are covered with inter-gate dielectric 20 or other material). An example technique for doing so includes a selective deposition, for example by selective atomic layer deposition of the charge-trapping material. For example where semiconductor material 24 comprises elemental silicon and sidewalls 55 (or walls of material thereover, such as inter-gate dielectric 20) comprise a silicon oxide and/or silicon nitride, elemental ruthenium may be selectively deposited to the elemental-form silicon by atomic layer deposition using cylcohexadienyl ruthenium $[(C_6H_8)Ru(CO)_3]$ as a precursor at about 5 Torr and about 200° C.

Referring to FIG. 6, charge-trapping islands 26/27 have been covered with oxidation-protective material 28 within lateral recess 57. Further, oxidation-protective material 28 extends along sidewalls 55 of inner and outer dielectric material 16, 14 (again, regardless of whether sidewalls 55 are covered with inter-gate dielectric 20 or other material). An example technique for doing so is chemical vapor deposition.

Referring to FIG. 7, second semiconductor material 30 has been formed within lateral recess 57 over oxidation-protective material 28. An example technique for doing so is chemical vapor deposition. Second semiconductor material 30 may be removed from being over sidewalls of oxidation-protective material 28 and/or sidewalls of dielectric material 14, 16, 20 by conducting a dry anisotropic etch thereof. Regardless, subsequent processing may be conducted to produce the example construction of FIG. 1. For example, tunnel dielectric 32 may be selectively grown laterally from second semiconductor material 30, followed by deposition of channel/active area material 34.

Figure 8:
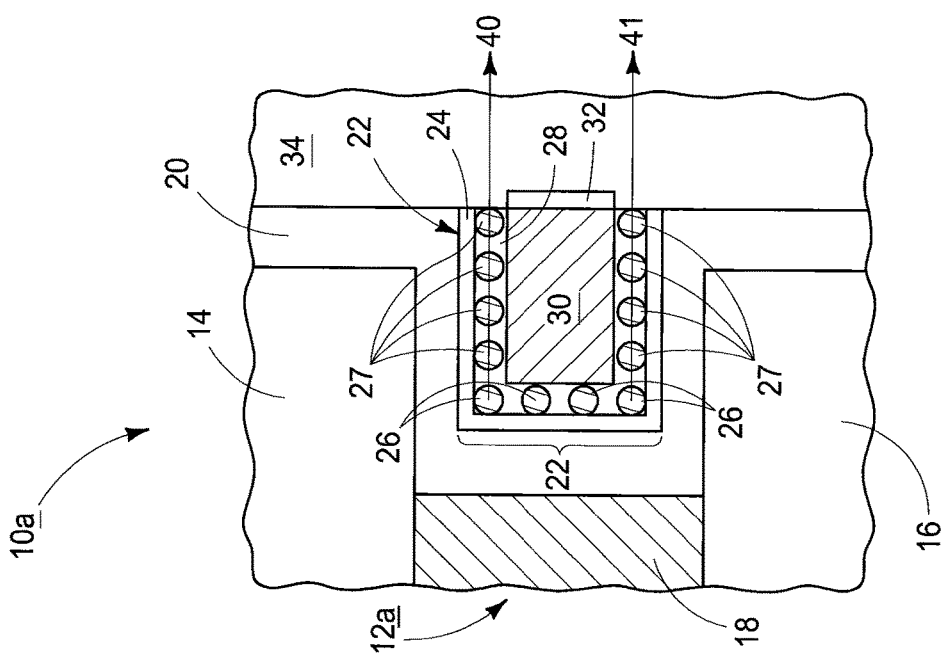
FIG. 8 is a view of an alternate embodiment substrate fragment to that shown by FIG. 1.

As alternate examples, oxidation-protective material 28 of FIG. 6 could be removed from being over sidewalls of dielectric material 14, 16, 20 prior to formation of second semiconductor material 30. Further alternately, oxidation-protective material 28 could be removed after forming second semiconductor material 30 and before or after forming the tunnel dielectric. In any such events, an alternate embodiment construction 10a may result as shown in FIG. 8. Like numerals from the above-described embodiment have been used where appropriate, with some construction differences being indicated with the suffix "a". No oxidation-protective material 28 is along sidewalls of dielectric material 14/16/20 with respect to substrate fragment 10a in FIG. 8, resulting in a charge-retaining transistor construction 12a.

Figure 9:
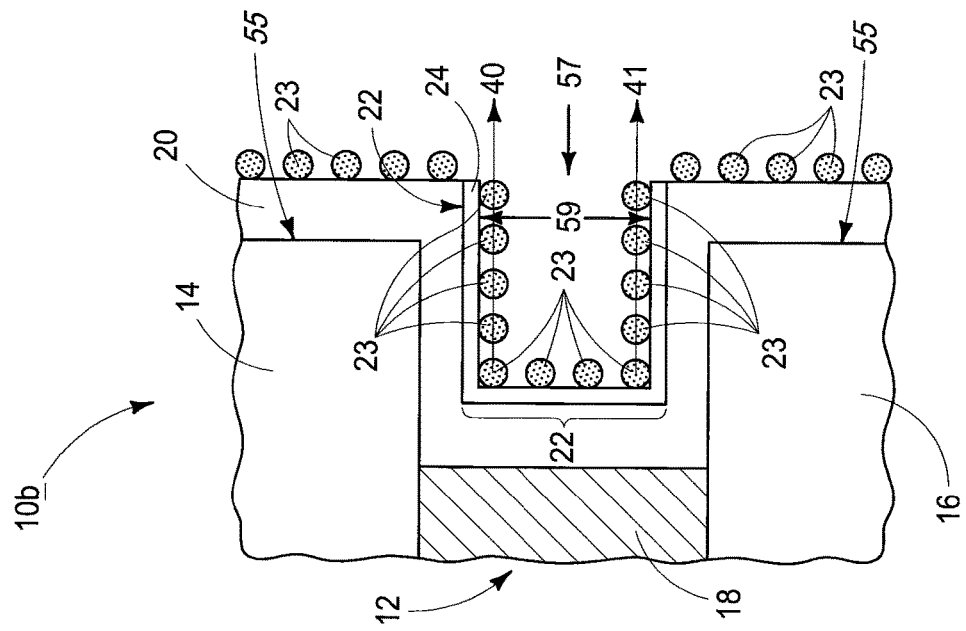
FIG. 9 is a view of an alternate embodiment substrate fragment to that shown by FIG. 5 at a processing step subsequent to that shown by FIG. 4.

Another alternate method embodiment is next described with reference to FIGS. 9-11. Referring to FIG. 9, an alternate embodiment substrate fragment 10b is shown in comparison to that of FIG. 5. Like numerals from the above-described embodiments have been used where appropriate, with some construction differences being indicated with the suffix "b" or with different numerals. In FIG. 9, walls 59 of lateral recess 57 comprise elemental silicon, for example as may occur when semiconductor material 24 comprises amorphous or crystalline silicon. Islands 23 of silicon-reactive material have been deposited within lateral recess 57 and along sidewalls of inner and outer dielectric 16, 14 (again, regardless of whether sidewalls 55 are covered with inter-gate dielectric 20 or other material). By way of example only, silicon-reactive materials include refractory metals, with ruthenium being one specific ideal example.

Figure 10:
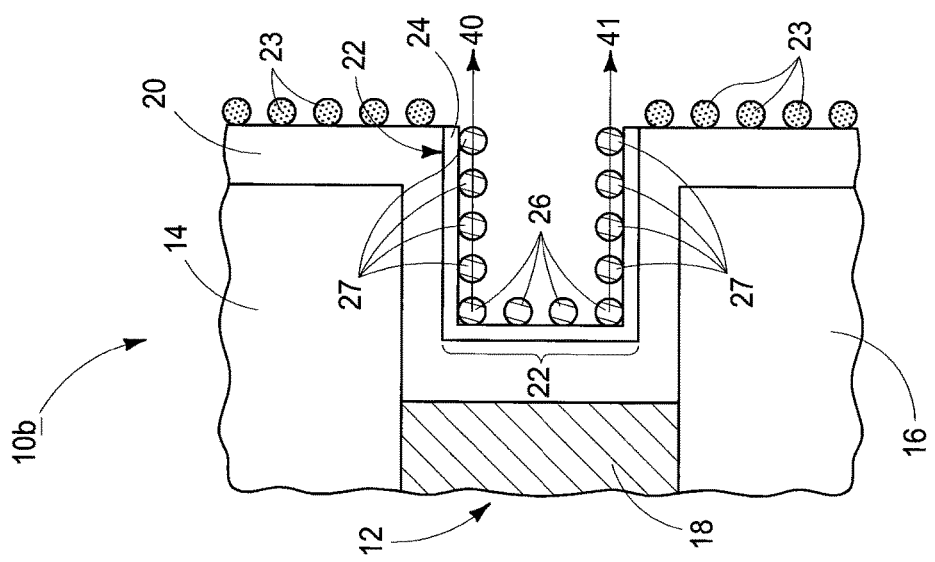
FIG. 10 is a view of the FIG. 9 substrate at a processing step subsequent to that shown by FIG. 9.
Figure 2:
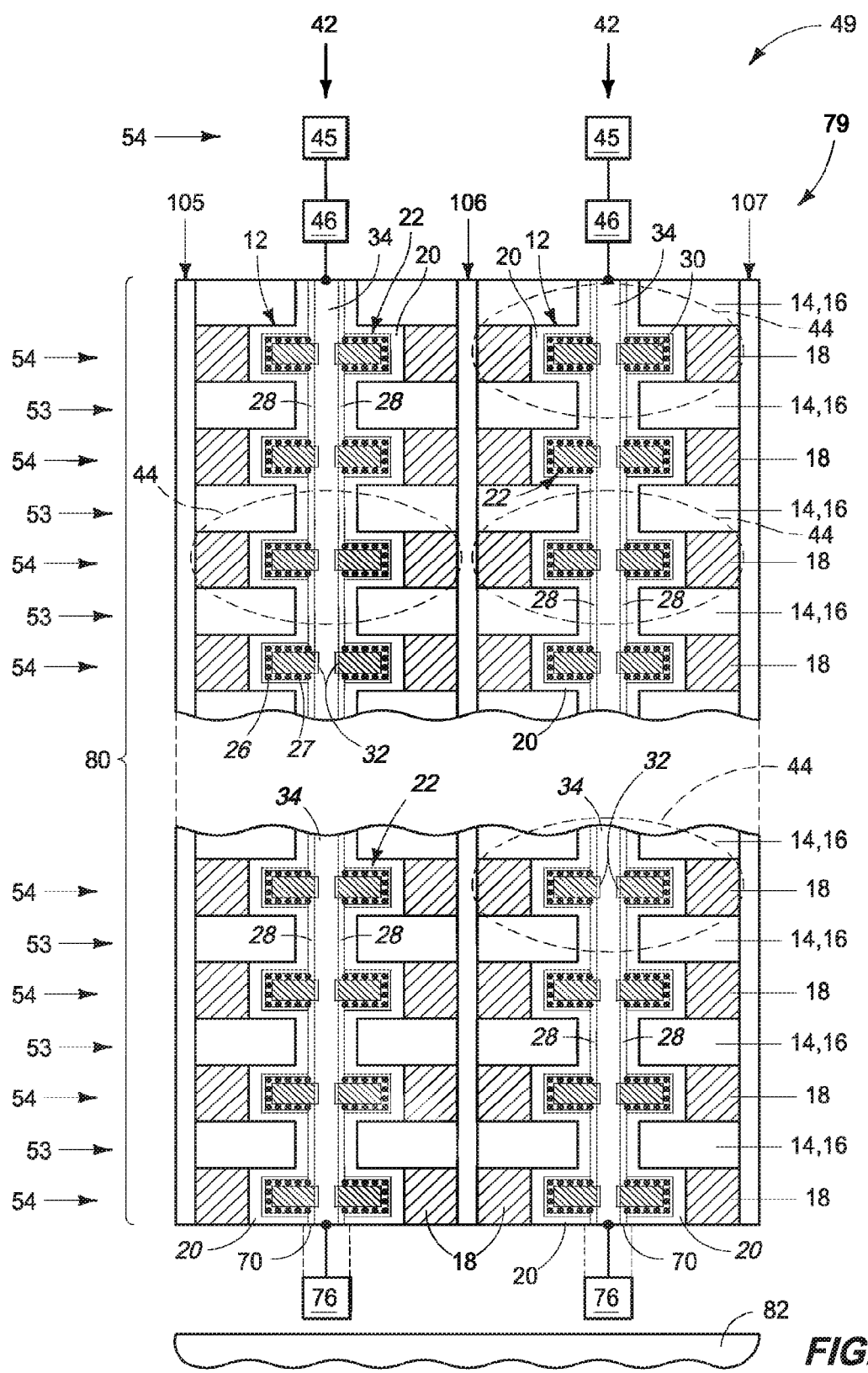

Referring to FIG. 10, silicon-reactive islands 23 have been selectively reacted with silicon within lateral recess 57 to form islands 26, 27 of charge-trapping material which comprise a silicide (e.g., ruthenium silicide) while leaving the silicon-reactive material 23 that is over inner and outer dielectric material 16, 14 (and 20 if present) unreacted. An example technique for doing so includes exposing substrate fragment 10*b* of FIG. 9 to a temperature of at from about 400° C. to about 500° C. for 2 minutes in an inert atmosphere (e.g., N$_2$) to cause the reaction to form silicide.

Figure 11:
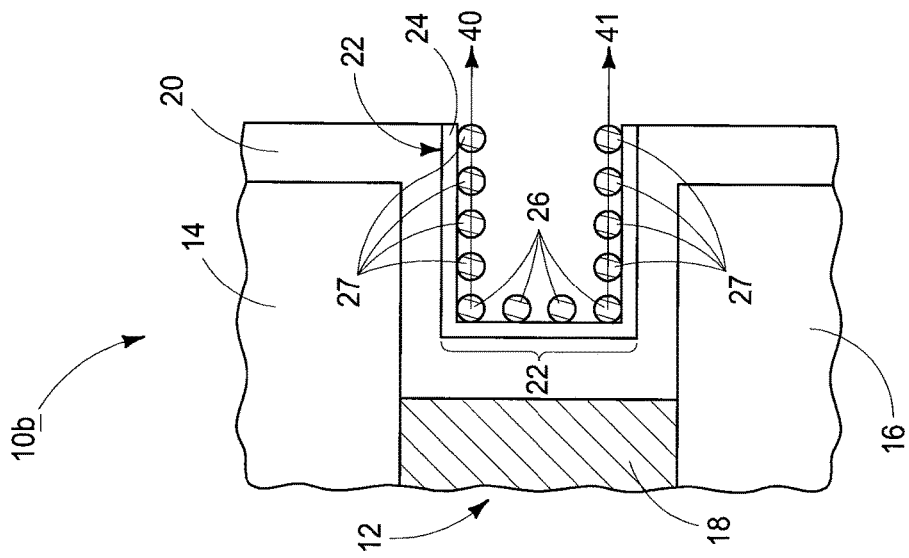
FIG. 11 is a view of the FIG. 10 substrate at a processing step subsequent to that shown by FIG. 10.

Referring to FIG. 11, unreacted silicon-reactive material 23 (not shown) has been selectively removed relative to silicide-containing islands 26/27. Such might be conducted by exposure to O$_3$ at a temperature of from about 200° C. to about 400° C. Processing may occur subsequently to produce any of the constructions of FIGS. 1, 2, and/or 8.

An embodiment of the invention encompasses selectively forming islands of charge-trapping material within the lateral recess on the semiconductive material relative to sidewalls of inner and outer dielectric material, and independent of whether oxidation-protective material is formed alongside those islands and independent of whether additional semiconductor material is formed alongside the islands and/or oxidation-protective material after forming the islands. In one embodiment, the act of selectively forming comprises selectively depositing the charge-trapping material to the semiconductor material which is within the lateral recess. In another embodiment, the act of selectively forming comprises forming the semiconductor material to comprise elemental silicon and depositing islands of silicon-reactive material within the lateral recess and along sidewalls of elevationally inner and outer dielectric. That silicon-reactive material is selectively reacted with silicon of the semiconductor material within the lateral recess to form islands of charge-trapping material to comprise a silicide while leaving the silicon-reactive material that is over sidewalls of the inner and outer dielectric material unreacted. Thereafter, the unreacted silicon-reactive material is selectively removed relative to the silicide.

In one embodiment, the islands are covered with an oxidation-protective material within the lateral recess prior to forming tunnel dielectric laterally of the islands. In one embodiment, semiconductive material (e.g., second semiconductor material) is formed within the lateral recess laterally over the oxidation-protective material prior to forming tunnel dielectric.

CONCLUSION

In some embodiments, a charge-retaining transistor comprises a control gate and an inter-gate dielectric alongside the control gate. A charge-storage node of the transistor comprises first semiconductor material alongside the inter-gate dielectric. Islands of charge-trapping material are alongside the first semiconductor material. An oxidation-protective material is alongside the islands. Second semiconductor material is alongside the oxidation-protective material, and is of some different composition from that of the oxidation-protective material. Tunnel dielectric is alongside the charge-storage node. Channel material is alongside the tunnel dielectric.

In some embodiments, a charge-retaining transistor comprises a control gate and an inter-gate dielectric alongside the control gate. A charge-storage node of the transistor comprises first islands of charge-trapping material alongside the inter-gate dielectric. A line of second islands of charge-trapping material angles laterally away from the first islands. Semiconductor material is alongside the first islands. Tunnel dielectric is alongside the charge-storage node semiconductor material. Channel material is alongside the tunnel dielectric.

In some embodiments, an array includes elevationally extending strings of memory cells. The strings individually comprise an active area pillar extending elevationally through alternating tiers of inter-tier dielectric material and transistor material. The transistor material comprises a control gate and inter-gate dielectric alongside the control gate. Also included is a charge-storage node which comprises islands of charge-trapping material. An oxidation-protective material is alongside the islands. Tunnel dielectric is laterally between the charge-storage node and the active area pillar. The oxidation-protective material extends elevationally alongside the active area pillar between the active area pillar and the inter-tier dielectric.

In some embodiments, a method of forming a charge-retaining transistor comprises providing a control gate and inter-gate dielectric alongside the control gate between elevationally inner and elevationally outer dielectric material. The control gate and the inter-gate dielectric are laterally recessed relative sidewalls of the inner and outer dielectric material, thereby forming a lateral recess. Semiconductor material is formed along sidewalls of the inner and outer dielectric material and to less-than-fill and line walls of the lateral recess. The semiconductor material is removed from being along the sidewalls of the inner and outer dielectric material, leaving the semiconductor material lining the walls of the lateral recess. After the removing, islands of charge-trapping material are selectively formed within the lateral recess on the semiconductor material relative to sidewalls of the inner and outer dielectric material. Tunnel dielectric is formed laterally of the islands. Channel material is formed alongside the tunnel dielectric.

In some embodiments, a method of forming a charge-retaining transistor comprises providing a control gate and inter-gate dielectric alongside the control gate between elevationally inner and elevationally outer dielectric material. The control gate and the inter-gate dielectric are laterally recessed relative sidewalls of the inner and outer dielectric material, thereby forming a lateral recess. Walls of the lateral recess comprise elemental silicon. Islands of silicon-reactive material are deposited within the lateral recess and along sidewalls of the inner and outer dielectric. The silicon-reactive material is selectively reacted with the silicon within the lateral recess to form islands of charge-trapping material comprising a silicide while leaving the silicon-reactive material that is over the inner and outer dielectric unreacted. The unreacted silicon-reactive material is removed selectively relative to the silicide. Tunnel dielectric is formed laterally of the islands. Channel material is formed alongside the tunnel dielectric.

In some embodiments, a method of forming a charge-retaining transistor comprises providing a control gate and inter-gate dielectric alongside the control gate between elevationally inner and elevationally outer dielectric material. The control gate and the inter-gate dielectric are laterally recessed relative sidewalls of the inner and outer dielectric material, thereby forming a lateral recess. First semiconductor material is formed along sidewalls of the inner and outer dielectric material and to less-than-fill and line walls of the lateral recess. The first semiconductor material is removed from being along the sidewalls of the inner and outer dielectric material, leaving the semiconductor material lining the walls of the lateral recess. After the removing, islands of charge-trapping material are selectively deposited within the lateral recess on the semiconductor material relative to sidewalls of the inner and outer dielectric material. The islands are covered with oxidation-protective material within the lateral recess. The oxidation-protective material extends along the inner and outer dielectric material sidewalls. Second semiconductor material is formed within the lateral recess over the oxidation-protective material. Tunnel dielectric is formed laterally of the second semiconductor material. Channel material is formed alongside the tunnel dielectric.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a charge-retaining transistor, comprising:
   providing a control gate and inter-gate dielectric alongside the control gate between elevationally inner and elevationally outer dielectric material, the control gate and the inter-gate dielectric being laterally recessed relative sidewalls of the inner and outer dielectric material thereby forming a lateral recess;
   forming semiconductor material along sidewalls of the inner and outer dielectric material and to less-than-fill and line walls of the lateral recess;
   removing the semiconductor material from being along the sidewalls of the inner and outer dielectric material and leaving the semiconductor material lining the walls of the lateral recess;
   after the removing, selectively forming islands of charge-trapping material within the lateral recess externally directly against external walls of the semiconductor material relative to sidewalls of the inner and outer dielectric material;
   forming tunnel dielectric laterally of the islands; and
   forming channel material alongside the tunnel dielectric.

2. The method of claim 1 wherein the selectively forming comprises selective deposition of the charge-trapping material to the semiconductor material relative to sidewalls of the inner and outer dielectric material.

3. The method of claim 2 wherein the selective deposition comprises atomic layer deposition.

4. The method of claim 2 comprising selective deposition of elemental ruthenium.

5. A method of forming a charge-retaining transistor, comprising:
   providing a control gate and inter-gate dielectric alongside the control gate between elevationally inner and elevationally outer dielectric material, the control gate and the inter-gate dielectric being laterally recessed relative sidewalls of the inner and outer dielectric material thereby forming a lateral recess;
   forming semiconductor material along sidewalls of the inner and outer dielectric material and to less-than-fill and line walls of the lateral recess;
   removing the semiconductor material from being along the sidewalls of the inner and outer dielectric material and leaving the semiconductor material lining the walls of the lateral recess;
   after the removing, selectively forming islands of charge-trapping material within the lateral recess on the semiconductor material relative to sidewalls of the inner and outer dielectric material;
   forming tunnel dielectric laterally of the islands;
   forming channel material alongside the tunnel dielectric;
   wherein the semiconductor material comprises elemental silicon, the selectively forming comprising:
   depositing islands of silicon-reactive material within the lateral recess and along sidewalls of the inner and outer dielectric;
   selectively reacting the silicon-reactive material with silicon of the semiconductor material within the lateral recess to form the islands of charge-trapping material to comprise a silicide while leaving the silicon-reactive material that is over the sidewalls of the inner and outer dielectric unreacted; and
   selectively removing the unreacted silicon-reactive material relative to the silicide.

6. A method of forming a charge-retaining transistor, comprising:
   providing a control gate and inter-gate dielectric alongside the control gate between elevationally inner and elevationally outer dielectric material, the control gate and the inter-gate dielectric being laterally recessed relative sidewalls of the inner and outer dielectric material thereby forming a lateral recess;
   forming semiconductor material along sidewalls of the inner and outer dielectric material and to less-than-fill and line walls of the lateral recess;
   removing the semiconductor material from being along the sidewalls of the inner and outer dielectric material and leaving the semiconductor material lining the walls of the lateral recess;
   after the removing, selectively forming islands of charge-trapping material within the lateral recess on the semiconductor material relative to sidewalls of the inner and outer dielectric material;
   forming tunnel dielectric laterally of the islands;
   after forming the tunnel dielectric laterally of the islands, forming channel material alongside the tunnel dielectric; and
   comprising covering the islands with oxidation-protective material within the lateral recess prior to forming the tunnel dielectric.

7. The method of claim 6 comprising forming semiconductive material within the lateral recess laterally over the oxidation-protective material prior to forming the tunnel dielectric.

8. The method of claim 7 comprising forming the semiconductive material directly against the oxidation-protective material.

9. A method of forming a charge-retaining transistor, comprising:
   providing a control gate and inter-gate dielectric alongside the control gate between elevationally inner and elevationally outer dielectric material, the control gate and the inter-gate dielectric being laterally recessed relative sidewalls of the inner and outer dielectric material thereby forming a lateral recess, walls of the lateral recess comprising elemental silicon;
   depositing islands of silicon-reactive material within the lateral recess and along sidewalls of the inner and outer dielectric;
   selectively reacting the silicon-reactive material with the silicon within the lateral recess to form islands of charge-trapping material comprising a silicide while leaving the silicon-reactive material that is over the inner and outer dielectric unreacted;
   selectively removing the unreacted silicon-reactive material relative to the silicide;
   forming tunnel dielectric laterally of the islands; and
   forming channel material alongside the tunnel dielectric.

10. A method of forming a charge-retaining transistor, comprising:

providing a control gate and inter-gate dielectric alongside the control gate between elevationally inner and elevationally outer dielectric material, the control gate and the inter-gate dielectric being laterally recessed relative sidewalls of the inner and outer dielectric material thereby forming a lateral recess;

forming first semiconductor material along sidewalls of the inner and outer dielectric material and to less-than-fill and line walls of the lateral recess;

removing the first semiconductor material from being along the sidewalls of the inner and outer dielectric material and leaving the first semiconductor material lining the walls of the lateral recess;

after the removing, selectively depositing islands of charge-trapping material within the lateral recess externally directly against external walls of the first semiconductor material relative to sidewalls of the inner and outer dielectric material;

covering the islands with oxidation-protective material within the lateral recess, the oxidation-protective material extending along the inner and outer dielectric material sidewalls;

forming second semiconductor material within the lateral recess over the oxidation-protective material;

forming tunnel dielectric laterally of the second semiconductor material; and forming channel material alongside the tunnel dielectric.

11. The method of claim 6 wherein the oxidation-protective material is directly against the charge-trapping material of the islands.

12. The method of claim 6 wherein the oxidation-protective material comprises $RuO_2$.

13. The method of claim 6 wherein the oxidation-protective material comprises silicon nitride.

14. The method of claim 6 wherein the oxidation-protective material comprises $HfO_x$.

15. The method of claim 6 wherein the oxidation-protective material is amorphous.

16. The method of claim 6 wherein the oxidation-protective material is crystalline.

17. The method of claim 1 wherein the channel material is formed after providing the control gate and the inter-gate dielectric.

18. The method of claim 17 wherein the channel material is formed after leaving the semiconductor material lining the walls of the lateral recess.

19. The method of claim 18 wherein the channel material is formed after the selectively forming of the islands.

20. The method of claim 10 wherein the channel material is formed after providing the control gate and the inter-gate dielectric.

21. The method of claim 20 wherein the channel material is formed after leaving the first semiconductor material lining the walls of the lateral recess.

22. The method of claim 21 wherein the channel material is formed after the selectively forming of the islands.

23. The method of claim 22 wherein the channel material is formed after covering the islands with the oxidation-protective material within the lateral recess.

24. The method of claim 23 wherein the channel material is formed after forming the second semiconductor material within the lateral recess over the oxidation-protective material.

* * * * *

UNITED STATES PATENT AND TRADEMARK OFFICE
CERTIFICATE OF CORRECTION

Page 1 of 2

PATENT NO.         : 9,818,756 B2
APPLICATION NO.    : 14/847436
DATED              : November 14, 2017
INVENTOR(S)        : D. V. Nirmal Ramaswamy It is certified that error appears in the above-identified patent and that said Letters Patent is hereby corrected as shown below:

Replace Drawing Sheet 2 of 5 with attached Drawing Sheet 2 of 5.

Signed and Sealed this
Twentieth Day of February, 2018

Andrei Iancu
*Director of the United States Patent and Trademark Office*